United States Patent
Shi et al.

(10) Patent No.: US 9,287,432 B2
(45) Date of Patent: Mar. 15, 2016

(54) GE—SI P-I-N PHOTODIODE WITH REDUCED DARK CURRENT AND FABRICATION METHOD THEREOF

(71) Applicant: SiFotonics Technologies Co., Ltd., Woburn, MA (US)

(72) Inventors: Tuo Shi, Beijing (CN); Liangbo Wang, Beijing (CN); Pengfei Cai, Beijing (CN); Ching-yin Hong, Lexington, MA (US); Mengyuan Huang, Beijing (CN); Wang Chen, Beijing (CN); Su Li, Beijing (CN); Dong Pan, Andover, MA (US)

(73) Assignee: SiFotonics Technologies Co, Ltd., Woburn, MA (US)

(*) Notice: Subject to any disclaimer, the term of this patent is extended or adjusted under 35 U.S.C. 154(b) by 0 days.

(21) Appl. No.: 14/339,443

(22) Filed: Jul. 23, 2014

(65) Prior Publication Data

US 2015/0028386 A1    Jan. 29, 2015

Related U.S. Application Data

(60) Provisional application No. 61/958,231, filed on Jul. 23, 2013.

(51) Int. Cl.
  *H01L 31/105* (2006.01)
  *H01L 31/0232* (2014.01)
  *H01L 31/18* (2006.01)

(52) U.S. Cl.
  CPC ........ *H01L 31/105* (2013.01); *H01L 31/02327* (2013.01); *H01L 31/1804* (2013.01)

(58) Field of Classification Search
  CPC ............ H01S 25/167; H01S 27/14643; H01S 27/1463; H01S 27/14601; H01S 27/307; H01S 31/105; H01S 31/02327; H01S 31/1804
  See application file for complete search history.

(56) References Cited

U.S. PATENT DOCUMENTS

| 7,871,854 B1* | 1/2011 | Spencer et al. ................ 438/97 |
| 2005/0156213 A1* | 7/2005 | Han et al. ...................... 257/292 |
| 2006/0214251 A1* | 9/2006 | Ratnam et al. ................. 257/437 |

* cited by examiner

*Primary Examiner* — Armando Rodriguez
(74) *Attorney, Agent, or Firm* — Han IP Corporation

(57) ABSTRACT

Various embodiments of a germanium-on-silicon (Ge—Si) photodiode are provided along with the fabrication method thereof. In one aspect, a Ge—Si photodiode includes a doped bottom region at the bottom of a germanium layer, formed by thermal diffusion of donors implanted into a silicon layer. The Ge—Si photodiode further includes a doped sidewall region of Ge mesa formed by ion implantation. Thus, the electric field is distributed in the intrinsic region of the Ge—Si photodiode where there is low dislocation density. The doped bottom region and sidewall region of the Ge layer prevent electric field from penetrating into the Ge—Si interface and Ge mesa sidewall region, where a large amount of dislocations are distributed. This design significantly suppresses dark current.

15 Claims, 2 Drawing Sheets

GE—SI P-I-N PHOTODIODE WITH REDUCED DARK CURRENT AND FABRICATION METHOD THEREOF

CROSS-REFERENCE TO RELATED PATENT APPLICATIONS

This is a non-provisional application that claims the priority benefit of U.S. Patent Application No. 61/958,231, filed on Jul. 23, 2013, which is incorporated by reference in its entirety.

TECHNICAL FIELD

The present disclosure relates to photonic devices. More particularly, the present disclosure relates to a photodiode structure and fabrication method thereof.

BACKGROUND

Strained germanium-on-silicon (Ge—Si) photodiodes have been favored for their advantages of easy integration, high speed, high absorption coefficient to communication wavelength and CMOS compatibility with silicon waveguides. Conventional Ge—Si photodiodes suffer from large dark current induced by the large lattice mismatch between germanium (Ge) and silicon (Si) materials. The 4.2% lattice mismatch induces a large amount of dislocations and defects along the Ge—Si interface and threading dislocations at the Ge mesa sidewall. As a proper bias is applied through the junction, the intrinsic germanium layer is easily depleted, thus the dislocations and defects are exposed in a strong electric field. Undesirably, this results in a large dark current. Besides, the dark current increases by 40~60% as temperature increase every 10° C., which will induce significantly performance degradation at high-temperature environment.

SUMMARY

This section highlights certain features of the inventive concept of the present disclosure, and in no way is to be interpreted as limiting the scope of the claimed subject matter as well as any deviations and derivatives thereof.

In one aspect, a photodiode may include: a substrate layer; a bottom contact layer of a first semiconductor material and disposed on the substrate layer, the bottom contact layer doped to exhibit a first conductive type; and an absorption layer of a second semiconductor material and disposed on the bottom contact layer. The absorption layer may include: a bottom doped region doped to exhibit the first conductive type; an ion-implanted sidewall region doped to exhibit the first conductive type; and an intrinsic region unintentionally doped or lightly doped to function as a depletion region. The photodiode may further include: a top contact layer doped to exhibit a second conductive type and disposed on the absorption layer; and an anti-reflection layer disposed on the top contact layer.

In some embodiments, the substrate may include a silicon substrate or a silicon-on-insulator (SOI) substrate.

In some embodiments, the first semiconductor material may include silicon.

In some embodiments, the second semiconductor material may include germanium. In some embodiments, the sidewall region of the absorption layer may include an inward-leaning sidewall.

In some embodiments, the first conductive type may be n-type and the second conductive type may be p-type. In some embodiments, a donor for the first conductive type may include arsenic, phosphorus, or a combination thereof.

In some embodiments, the first conductive type may be p-type and the second conductive type may be n-type. In some embodiments, a donor for the first conductive type may include boron.

In some embodiments, the bottom contact layer may include a heavily doped region near a bottom portion thereof and a relatively lighter doped region near a top portion thereof.

In some embodiments, the bottom doped region of the absorption layer may be doped by in-situ doping during a layer epitaxial process.

In some embodiments, the bottom doped region of the absorption layer may be doped by donor diffusion during high temperature annealing process in a temperature range of 600~900°. A diffusing donor source may be the bottom contact layer a bottom portion thereof is n-type doped.

In some embodiments, a doping profile of the bottom doped region of the absorption layer may be gradually doped with higher concentration at an interface between the bottom contact layer and the absorption layer, and with lower concentration away from the interface between the bottom contact layer and the absorption layer.

In some embodiments, the absorption layer may include a top doped region doped to exhibit the second conductive type.

In some embodiments, a doped region of the top contact layer may be at least 1-um smaller than the sidewall region of the absorption layer.

In some embodiments, the top doped region of the absorption layer may be formed by ion implantation.

In another aspect, a method of forming a photodiode may include: forming a silicon-on-insulator (SOI) substrate; forming a bottom contact layer on the substrate, the bottom contact layer doped to exhibit a first conductive type by ion implantation; forming a thin silicon layer on the bottom contact layer by epitaxy; forming a relatively lighter doped region of the first conductive type on the thin silicon layer by ion implantation; forming an unintentionally doped germanium layer on the thin silicon layer by epitaxy; forming a bottom doped region of the germanium layer by thermal treating; forming a doped sidewall region of the germanium layer by ion implantation at a sidewall of the germanium layer; forming a thin amorphous silicon layer on the germanium layer; forming a top contact layer by ion implantation on the amorphous silicon layer, the top contact layer doped to exhibit a second conductive type, a doped region of the top contact layer is at least 1-um smaller than the doped sidewall region of the germanium layer; and forming an anti-reflection coating layer on the top contact layer by deposition.

In some embodiments, a concentration of a top surface of the thin silicon layer may be controlled within a range of approximately 2E17~5E18 cm$^{-3}$.

In some embodiments, impurities implanted into the thin silicon layer may diffuse into a bottom portion of the germanium layer during thermal annealing process at high temperature in a range of approximately 600~900° C.

In some embodiments, a total dosage of the doped sidewall region may be within a range of approximately 1E12~1E15 cm$^{-2}$.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Example Implementations

To solve the aforementioned problems, the present disclosure provides a photodiode with a bottom doped region and a doped sidewall region of the absorption layer, which is designed to suppress the dark current.

Figure 1:
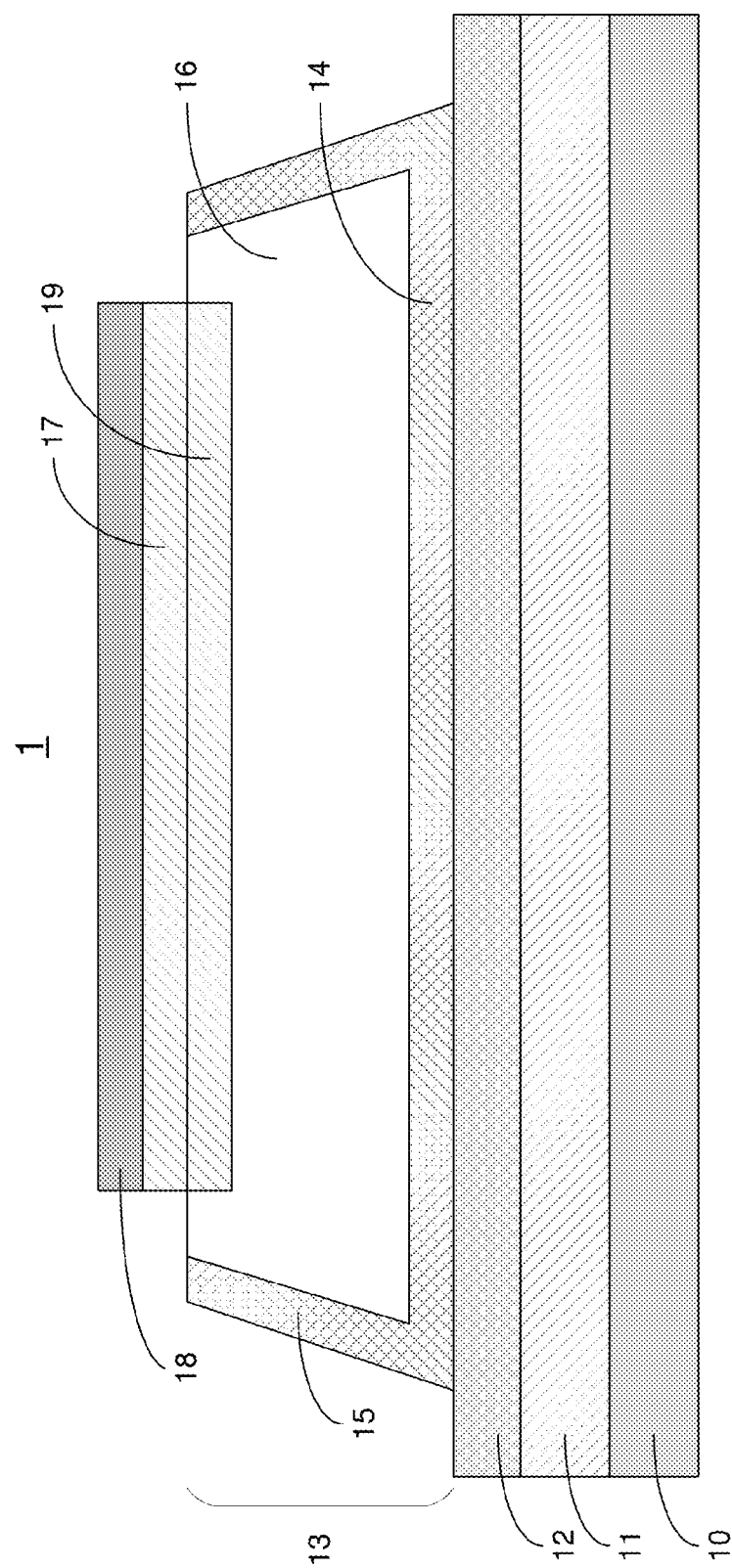
FIG. 1 is a cross-sectional view of a Ge—Si photodiode structure comprising a doped Ge mesa sidewall by ion implantation, and a doped Ge layer at the Ge—Si interface by ion implantation and diffusion.
Figure 2:
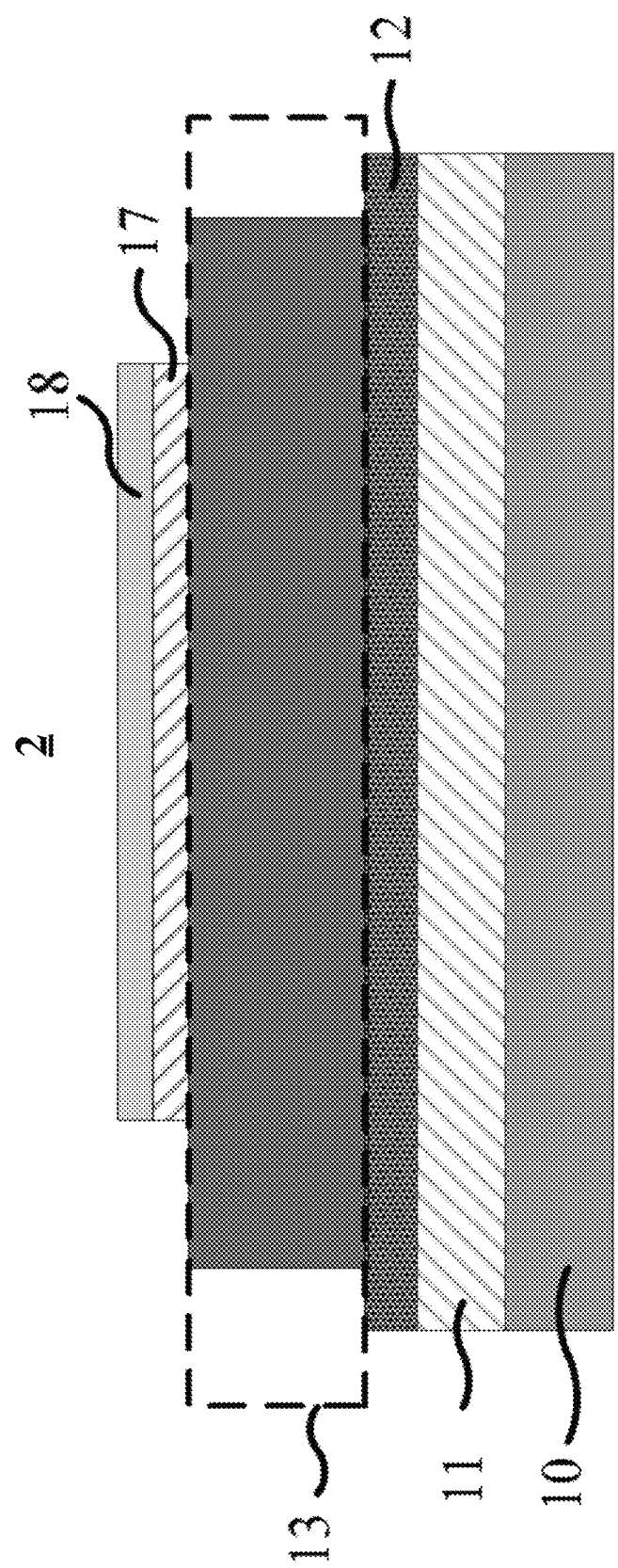
FIG. 2 is a cross-sectional view of a conventional Ge—Si photodiode structure.

FIG. 1 is a cross-sectional view of a structure of a Ge—Si photodiode 1. As shown in FIG. 1, Ge—Si photodiode 1 includes a Ge mesa sidewall which is doped by ion implantation. Ge—Si photodiode 1 also includes a doped Ge layer at the Ge—Si interface by ion implantation and diffusion. To reduce dark current of conventional Ge—Si photodiodes, the Ge—Si photodiode 1 includes at least a SOI substrate 10, an $n^+$-doped bottom contact layer 11, an n-doped bottom contact thin silicon layer 12, a germanium layer 13, a top contact layer 17 and an anti-reflection layer 18. The germanium layer 13 includes a bottom doped region 14, formed by high temperature thermal treating so that the donors of n-dope thin silicon layer 12 diffuse into the bottom portion of the germanium layer 13. The germanium layer 13 also includes a top doped region 19, which may be formed by ion implantation. The sidewall of germanium layer 13 is further implanted with donors to exhibit n-type conductive type, forming a doped Ge mesa sidewall 15. The germanium layer 13 is formed by an epitaxial process, where there is a large lattice mismatch between germanium and silicon materials, thus there are a lot of mismatch dislocations and defects along the Ge—Si interface and germanium mesa sidewall. As n-type doped bottom region 14 and n-typed doped Ge mesa sidewall 15 are formed, an electric field is distributed in the intrinsic germanium region 16 and cannot penetrate through the doped region. Advantageously, leakage current induced from the dislocations and defects are significantly reduced.

In view of the above, features of the present disclosure are highlighted below.

In one aspect, a photodiode may include: a substrate layer; a bottom contact layer of a first semiconductor material and disposed on the substrate layer, the bottom contact layer doped to exhibit a first conductive type; and an absorption layer of a second semiconductor material and disposed on the bottom contact layer. The absorption layer may include: a bottom doped region doped to exhibit the first conductive type; an ion-implanted sidewall region doped to exhibit the first conductive type; and an intrinsic region unintentionally doped or lightly doped to function as a depletion region. The photodiode may further include: a top contact layer doped to exhibit a second conductive type and disposed on the absorption layer; and an anti-reflection layer disposed on the top contact layer.

In some embodiments, the substrate may include a silicon substrate or a silicon-on-insulator (SOI) substrate.

In some embodiments, the first semiconductor material may include silicon.

In some embodiments, the second semiconductor material may include germanium. In some embodiments, the sidewall region of the absorption layer may include an inward-leaning sidewall.

In some embodiments, the first conductive type may be n-type and the second conductive type may be p-type. In some embodiments, a donor for the first conductive type may include arsenic, phosphorus, or a combination thereof.

In some embodiments, the first conductive type may be p-type and the second conductive type may be n-type. In some embodiments, a donor for the first conductive type may include boron.

In some embodiments, the bottom contact layer may include a heavily doped region near a bottom portion thereof and a relatively lighter doped region near a top portion thereof.

In some embodiments, the bottom doped region of the absorption layer may be doped by in-situ doping during a layer epitaxial process.

In some embodiments, the bottom doped region of the absorption layer may be doped by donor diffusion during high temperature annealing process in a temperature range of 600~900°. A diffusing donor source may be the bottom contact layer, a bottom portion thereof being n-type doped.

In some embodiments, a doping profile of the bottom doped region of the absorption layer may be gradually doped with higher concentration at an interface between the bottom contact layer and the absorption layer, and with lower concentration away from the interface between the bottom contact layer and the absorption layer.

In some embodiments, the absorption layer may include a top doped region doped to exhibit the second conductive type.

In some embodiments, a doped region of the top contact layer may be at least 1-um smaller than the sidewall region of the absorption layer.

In some embodiments, the top doped region of the absorption layer may be formed by ion implantation.

In another aspect, a method of forming a photodiode may include: forming a silicon-on-insulator (SOI) substrate; forming a bottom contact layer on the substrate, the bottom contact layer doped to exhibit a first conductive type by ion implantation; forming a thin silicon layer on the bottom contact layer by epitaxy; forming a relatively lighter doped region of the first conductive type on the thin silicon layer by ion implantation; forming an unintentionally doped germanium layer on the thin silicon layer by epitaxy; forming a bottom doped region of the germanium layer by thermal treating; forming a doped sidewall region of the germanium layer by ion implantation at a sidewall of the germanium layer; forming a thin amorphous silicon layer on the germanium layer; forming a top contact layer by ion implantation on the amorphous silicon layer, the top contact layer doped to exhibit a second conductive type, a doped region of the top contact layer is at least 1-um smaller than the doped sidewall region of the germanium layer; and forming an anti-reflection coating layer on the top contact layer by deposition.

In some embodiments, a concentration of a top surface of the thin silicon layer may be controlled within a range of approximately 2E17~5E18 $cm^{-3}$.

In some embodiments, impurities implanted into the thin silicon layer may diffuse into a bottom portion of the germanium layer during thermal annealing process at high temperature in a range of approximately 600~900° C.

In some embodiments, a total dosage of the doped sidewall region may be within a range of approximately 1E12~1E15 cm$^{-2}$.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A photodiode comprising:
    a substrate layer;
    a bottom contact layer of a first semiconductor material and disposed on the substrate layer, the bottom contact layer doped to exhibit a first conductive type;
    an absorption layer of a second semiconductor material and disposed on the bottom contact layer, the absorption layer comprising:
        a bottom doped region doped to exhibit the first conductive type, wherein a doping profile of the bottom doped region is gradually doped with higher concentration at an interface between the bottom contact layer and the absorption layer, and with lower concentration away from the interface between the bottom contact layer and the absorption layer;
        an ion-implanted sidewall region doped to exhibit the first conductive type; and
        an intrinsic region unintentionally doped or lightly doped to function as a depletion region;
    a top contact layer doped to exhibit a second conductive type and disposed on the absorption layer; and
    an anti-reflection layer disposed on the top contact layer.

2. The photodiode of claim 1, wherein the substrate comprises a silicon substrate or a silicon-on-insulator (SOI) substrate.

3. The photodiode of claim 1, wherein the first semiconductor material comprises silicon.

4. The photodiode of claim 1, wherein the second semiconductor material comprises germanium.

5. The photodiode of claim 4, wherein the sidewall region of the absorption layer comprises an inward-leaning sidewall.

6. The photodiode of claim 1, wherein the first conductive type is n-type and the second conductive type is p-type.

7. The photodiode of claim 6, wherein a donor for the first conductive type comprises arsenic, phosphorus, or a combination thereof.

8. The photodiode of claim 1, wherein the first conductive type is p-type and the second conductive type is n-type.

9. The photodiode of claim 8, wherein a donor for the first conductive type comprises boron.

10. The photodiode of claim 1, wherein the bottom contact layer comprises a heavily doped region near a bottom portion thereof and a relatively lighter doped region near a top portion thereof.

11. The photodiode of claim 1, wherein the bottom doped region of the absorption layer is doped by in-situ doping during a layer epitaxial process.

12. The photodiode of claim 1, wherein the bottom doped region of the absorption layer is doped by donor diffusion during high temperature annealing process in a temperature range of 600~900°, wherein a diffusing donor source is the bottom contact layer, a bottom portion thereof being n-type doped.

13. The photodiode of claim 1, wherein the absorption layer comprises a top doped region doped to exhibit the second conductive type.

14. The photodiode of claim 1, wherein a doped region of the top contact layer is at least 1-um smaller than the sidewall region of the absorption layer.

15. The photodiode of claim 13, wherein the top doped region of the absorption layer is formed by ion implantation.

* * * * *